United States Patent
Hayashi et al.

(10) Patent No.: US 7,906,259 B2
(45) Date of Patent: Mar. 15, 2011

(54) REFLECTIVE MASK BLANK FOR EUV LITHOGRAPHY

(75) Inventors: Kazuyuki Hayashi, Tokyo (JP); Kazuo Kadowaki, Tokyo (JP); Takashi Sugiyama, Tokyo (JP); Masaki Mikami, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 269 days.

(21) Appl. No.: 12/205,967

(22) Filed: Sep. 8, 2008

(65) Prior Publication Data

US 2009/0011341 A1  Jan. 8, 2009

Related U.S. Application Data

(63) Continuation of application No. PCT/JP2007/059002, filed on Apr. 19, 2007.

(30) Foreign Application Priority Data

Apr. 21, 2006  (JP) ................................. 2006-117992

(51) Int. Cl.
*G03F 1/00* (2006.01)
(52) U.S. Cl. .......................................................... 430/5
(58) Field of Classification Search .............. 430/5, 394; 428/428, 430; 378/35
See application file for complete search history.

(56) References Cited

U.S. PATENT DOCUMENTS

| | | | |
|---|---|---|---|
| 7,390,596 B2 * | 6/2008 | Ishibashi et al. | 430/5 |
| 2008/0182183 A1 | 7/2008 | Hayashi et al. | |
| 2008/0199787 A1 | 8/2008 | Hayashi et al. | |
| 2009/0011341 A1 | 1/2009 | Hayashi et al. | |

FOREIGN PATENT DOCUMENTS

| | | |
|---|---|---|
| EP | 1 498 936 | 1/2005 |
| JP | 2004-6799 | 1/2004 |
| WO | 2006/030627 | 3/2006 |

OTHER PUBLICATIONS

Tsutomu Shoki, et al., "Process development of 6-inch EUV mask with TaBN absorber", Proceedings of the SPIE—The International Society for Optical Engineering SPIE-Int. Soc. Opt. Eng USA, vol. 4754, 2002, pp. 857-864, XP002439412 ISSN: 0277-786X.
U.S. Appl. No. 11/401,863, filed Apr. 12, 2006, Takaki et al.
U.S. Appl. No. 12/578,648, filed Oct. 14, 2009, Hayashi et al.
U.S. Appl. No. 12/855,053, filed Aug. 12, 2010, Hayashi et al.

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

To provide a reflective mask blank for EUV lithography having an absorber layer, which presents a low reflectance to a light in the wavelength ranges of EUV light and pattern inspection light, and which is easily controlled to have desired film composition and film thickness. A reflective mask blank for EUV lithography, comprising a substrate, and a reflective layer for reflecting EUV light and an absorber layer for absorbing EUV light formed in this order on the substrate, wherein the absorber layer contains tantalum (Ta), boron (B), silicon (Si) and nitrogen (N), and in the absorber layer, the B content is at least 1 at % and less than 5 at %, the Si content is from 1 to 25 at %, and the compositional ratio of Ta to N (Ta:N) is from 8:1 to 1:1.

28 Claims, 1 Drawing Sheet

REFLECTIVE MASK BLANK FOR EUV LITHOGRAPHY

TECHNICAL FIELD

The present invention relates to a reflective mask blank for EUV (Extreme Ultra Violet) lithography (hereinbelow, referred to as "EUV mask blank" in this Description) to be used for semiconductor manufacturing or the like.

BACKGROUND ART

In the semiconductor industry, a photolithography method using visible light or ultraviolet light has been employed as a technique for writing, on a Si substrate or the like, a fine pattern, which is required for writing an integrated circuit comprising such a fine pattern. However, the conventional exposure techniques using light exposure have been close to the limit of the conventional photolithography method while semiconductor devices have had finer patterns at an accelerated pace. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, has been considered as being promising as the exposure technique for 45 nm or below. In this Description, it should be noted that the phrase "EUV light" means a ray having a wavelength in a soft X ray region or a vacuum ultraviolet ray region, specifically a ray having a wavelength of about 10 to 20 nm, in particular, of about 13.5 nm±0.3 nm.

It is impossible to use EUV light in conventional dioptric systems as in photolithography using visible light or ultraviolet light since EUV light is apt to be absorbed by any substances and since the refractive index is of the substances is close to 1 at the above wavelength. For this reason, a catoptric system, i.e., a combination of a reflective photomask and a mirror, is employed in EUV light lithography.

A mask blank is a stacked member to be used for fabrication of a photomask, which has not been patterned yet. In the case of an EUV mask blank, it has a structure wherein a substrate made of glass or the like has a reflective layer for reflecting EUV light and an absorber layer for absorbing EUV light, formed thereon in this order. The reflective layer normally comprises a reflective multilayer film, which comprises high-refractive layers and low-refractive layers alternately stacked to increase a light reflectance when irradiating a film surface with EUV light. The absorber layer comprises a material having a high absorption coefficient in connection with EUV light, specifically, for example, a material containing Cr or Ta as the main component.

Patent Document 1 discloses a nitride of a tantalum/boron alloy (TaBN), an oxide of a tantalum/boron alloy (TaBO) and an oxynitride of a tantalum/boron alloy (TaBNO) which have a high absorption coefficient to EUV light and have a low reflectance to deep ultraviolet light in the wavelength range (190 nm to 260 nm) of pattern inspection light, as preferred materials of an absorber layer.

Further, Patent Document 1 discloses that the absorber layer preferably has an amorphous structure in order that the absorber layer has a surface excellent in smoothness, and in order that a TaBN film, a TaBO film and a TaBNO film have an amorphous structure, the B content in these films is preferably from 5 to 25 at %.

Patent Document 1: JP-A-2004-6799

DISCLOSURE OF THE INVENTION

Problems that the Invention is to Solve

However, in a case where the absorber layer is a TaBO film or a TaBNO film, if the O content in the film increases, insulating property of the absorber layer tends to increase, and charge up may occur at the time of the electron beam lithography on the absorber layer, such being unfavorable.

On the other hand, in a case where the absorber layer is a TaBN film, charge up will not occur at the time of electron beam lithography.

When the absorber layer is a TaBN film, the film is deposited by e.g. magnetron sputtering with which defects are less likely to occur. In such a case, a TaBN film can be formed by using, for example, a Ta target and a B target and discharging these targets simultaneously in a nitrogen atmosphere. Otherwise, the TaBN film can be formed also by using a target of a TaB compound and discharging the target in nitrogen atmosphere.

However, in the case of a method employing a Ta target and a B target, as the B target has a high resistance and is a light element, its deposition rate is 1/10 or below as compared with the Ta target in many cases. Thus, in order to add B in a content (at least 5 at %) required to make the crystal structure of the film be amorphous as disclosed in Patent Document 1, it is required to lower the deposition rate of the Ta target, which remarkably decreases the production efficiency.

On the other hand, in the case of a method using a TaB compound target, in a case where a compound target containing 20 at % of B and 80 at % of Ta is used for example, the maximum content of B actually added into the film is about 6 at %, and it is difficult to control the B content in the film to be at least 5 at %. Further, when N is added, the B content in the film will be at most 4 at %, and the crystal structure of the film cannot be made amorphous.

In order to solve the above problems, an increase in the B content in the film is expected by further increasing the B content in the TaB compound target (for example, B: 50 at % and Ta: 50 at %). However, as the B content in the TaB target increases, the resistance of the TaB target tends to increase, whereby discharge tends to be unstable and the deposition rate tends to be low. By unstable discharge, there may be dispersion of the composition of the film or the film thickness, or in some cases, film deposition cannot be conducted.

Means of Solving the Problems

To solve the above problems of prior art, it is an object of the present invention to provide an EUV mask blank excellent in properties as an EUV mask blank, particularly having an absorber layer which has a low reflectance in the wavelength range of EUV light and pattern inspection light and which is easily controlled to have desired film composition and film thickness.

The present inventors have conducted extensive studies to solve the above problems and as a result, found that an absorber layer which has an amorphous structure, which is excellent in etching properties and optical properties and which can be stably produced, is obtained even with a B content of the film less than 5 at %, when the film composition is TaBNSi, not TaBN.

The present invention has been made on the basis of the above discovery and provides a reflective mask blank for EUV lithography, comprising a substrate, and a reflective layer for reflecting EUV light and an absorber layer for absorbing EUV light formed in this order on the substrate, wherein the absorber layer contains tantalum (Ta), boron (B), silicon (Si) and nitrogen (N), and in the absorber layer, the B content is at least 1 at % and less than 5 at %, the Si content is from 1 to 25 at %, and the compositional ratio of Ta to N (Ta:N) is from 8:1 to 1:1.

The present invention further provides a reflective mask blank for EUV lithography, comprising a substrate, and a reflective layer for reflecting EUV light and an absorber layer for absorbing EUV light formed in this order on the substrate, wherein the absorber layer contains tantalum (Ta), boron (B), silicon (Si) and nitrogen (N), and the absorber layer is in an amorphous state.

In the EUV mask blank of the present invention, the surface roughness on the surface of the absorber layer is preferably at most 0.5 nm rms.

In the EUV mask blank of the present invention, it is preferred that a low reflective layer to inspection light to be used for inspection of a mask pattern is formed on the absorber layer, that the low reflective layer contains tantalum (Ta), boron (B), silicon (Si) and oxygen (O), and that in the low reflective layer, the B content is at least 1 at % and less than 5 at %, the Si content is from 1 to 25 at %, and the compositional ratio of Ta to O (Ta:O) is from 7:2 to 1:2.

Further, the EUV mask blank of the present invention is preferably such that a low reflective layer to inspection light to be used for inspection of a mask pattern, is formed on the absorber layer, that the low reflective layer contains tantalum (Ta), boron (B), silicon (Si), oxygen (O) and nitrogen (N), and that in the low reflective layer, the B content is at least 1 at % and less than 5 at %, the Si content is from 1 to 25 at %, and the compositional ratio of Ta to O and N (Ta:(O+N)) is from 7:2 to 1:2.

Further, the present invention provides a reflective mask blank for EUV lithography comprising a substrate, and a reflective layer for reflecting EUV light, an absorber layer for absorbing EUV light and a low reflective layer to inspection light to be used for inspection of a mask pattern, are formed in this order on the substrate, wherein the low reflective layer contains tantalum (Ta), boron (B), silicon (Si) and oxygen (O), and in the low reflective layer, the B content is at least 1 at % and less than 5 at %, the Si content is from 1 to 25 at %, and the compositional ratio of Ta to O (Ta:O) is from 7:2 to 1:2.

Further, the present invention provides a reflective mask blank for EUV lithography comprising a substrate, and a reflective layer for reflecting EUV light, an absorber layer for absorbing EUV light and a low reflective layer to inspection light to be used for inspection of a mask pattern, are formed in this order on the substrate, wherein the low reflective layer contains tantalum (Ta), boron (B), silicon (Si), oxygen (O) and nitrogen (N), and in the low reflective layer, the B content is at least 1 at % and less than 5 at %, the Si content is from 1 to 25 at %, and the compositional ratio of Ta to O and N (Ta:(O+N)) is from 7:2 to 1:2.

In a case where a low reflective layer is formed on the absorber layer, the surface roughness on the surface of the low reflective layer is preferably at most 0.5 nm rms.

In a case where a low reflective layer is formed on the absorber layer, the low reflective layer preferably has a thickness of from 5 to 30 nm.

Further, the EUV mask blank of the present invention is preferably such that a protective layer for protecting the reflective layer at the time of forming a pattern on the absorber layer is formed between the reflective layer and the absorber layer, and that the contrast is at least 30% as between the reflected light on the surface of the protective layer and the reflected light on the surface of the low reflective layer at a wavelength of light to be used for inspection of a pattern to be formed on the absorber layer.

In a case where a protective layer is formed between the reflective layer and the absorber layer, the protective layer is preferably formed by any one of Ru, $SiO_2$ and CrN.

In a case where a low reflective layer is formed on the absorber layer, the reflectance on the surface of the low reflective layer is at most 15% at a wavelength of light to be used for inspection of a pattern to be formed on the absorber layer.

Of the EUV mask blank of the present invention, the absorber layer is preferably formed by sputtering using a TaBSi compound target in an atmosphere containing nitrogen.

The TaBSi compound target preferably has a composition of Ta=50 to 94 at %, Si=5 to 30 at % and B=1 to 20 at %.

In a case where a low reflective layer is formed on the absorber layer, the low reflective layer is preferably formed by sputtering using a TaBSi compound target in an atmosphere containing oxygen.

The TaBSi compound target preferably has a composition of Ta=50 to 94 at %, Si=5 to 30 at % and B=1 to 20 at %.

Effects of the Invention

The EUV mask blank of the present invention is, since the B content in the absorber layer is low (less than 5 at %), free from problems caused by a decrease in the deposition rate or unstable discharge during film deposition, specifically, a dispersion of the film composition or the film thickness, or impossibility of film deposition, at the time of film deposition of the absorber layer.

In the EUV mask blank of the present invention, the surface of the absorber layer is excellent in smoothness since the absorber layer has an amorphous structure.

Further, the EUV mask blank of the present invention has excellent properties as an EUV mask blank, such as a low reflectance to EUV light and a low reflectance to light in the wavelength range of pattern inspection light.

By forming a low reflective layer on the absorber layer in the EUV mask blank of the present invention, the reflectance to light in the wavelength range of pattern inspection light can be further suppressed, whereby a favorable contrast at the time of pattern inspection to be carried out after formation of a pattern on the mask blank will be obtained.

By using a TaBSi compound target having a specific composition at the time of forming an absorber layer and a low reflective layer by sputtering for the EUV mask blank of the present invention, it is possible to avoid unstable discharge or dispersion of the film composition or the film thickness.

MEANINGS OF REFERENCE NUMERALS

1: EUV mask blank
11: substrate
12: reflective layer (reflective multilayer film)
13: protective layer 14: absorber layer
15: low reflective layer

BEST MODE FOR CARRYING OUT THE INVENTION

Now, the present invention will be described in detail with reference to the drawings.

Figure 1:
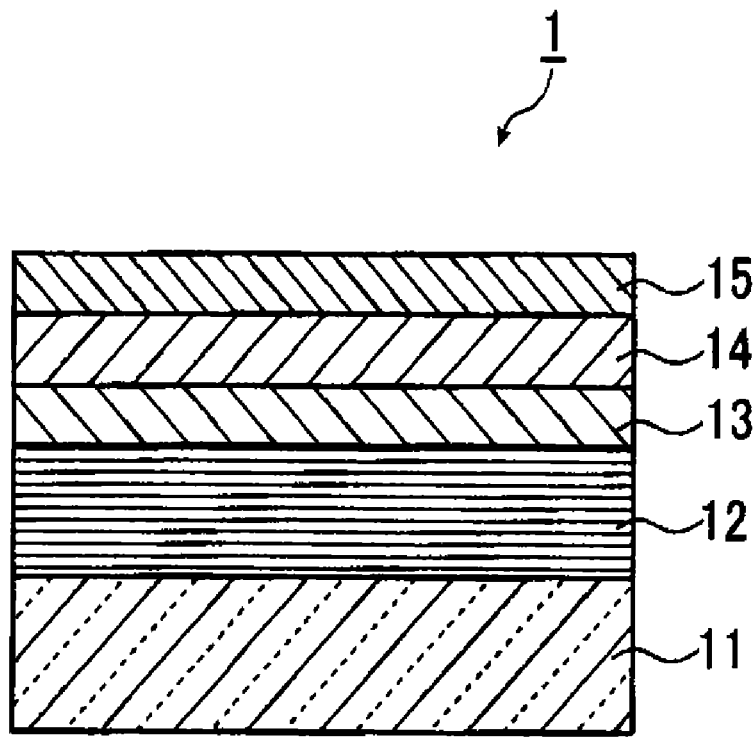
FIG. 1 is a cross-section schematically illustrating one embodiment of an EUV mask blank of the present invention.

FIG. 1 is a cross-section schematically illustrating one embodiment of an EUV mask blank of the present invention. The mask blank 1 shown in FIG. 1 comprises a substrate 11, and a reflective layer 12 for reflecting EUV light and an absorber layer 14 for absorbing EUV light formed in this order on the substrate 11. Between the reflective layer 12 and the absorber layer 14, a protective layer 13 for protecting the reflective layer 12 at the time of forming a pattern on the absorber layer 14 is formed. On the absorber layer 14, a low reflective layer 15 to inspection light to be used for inspection of a mask pattern is formed. However, in the EUV mask blank 1 of the present invention, only the substrate 11, the reflective layer 12 and the absorber layer 14 are essential in the structure shown in FIG. 1, and the protective layer 13 and the low reflective layer 15 are optional constituents.

Now, the respective constituents in the mask blank 1 will be described below.

The substrate 11 is required to satisfy properties as a substrate for an EUV mask blank. Accordingly, the substrate 11 is preferably one having a low coefficient of thermal expansion (preferably $0\pm1.0\times10^{-7}/°$ C., more preferably $0\pm0.3\times10^{-7}/°$ C., furthermore preferably $0\pm0.2\times10^{-7}/°$ C., still more preferably $0\pm0.1\times10^{-7}/°$ C., particularly preferably $0\pm0.05\times10^{-7}/°$ C.) and being excellent in smoothness, flatness and resistance to a cleaning liquid to be used e.g. for a mask blank or a photomask after formation of a pattern. As the substrate 11, specifically, glass having a low coefficient of thermal expansion, such as a $SiO_2$—$TiO_2$ glass may be used, but the substrate is not limited thereto, and a substrate made of crystallized glass with a β quartz solid solution precipitated therein, quartz glass, silicon, metal or the like may also be used.

The substrate 11 preferably has a smooth surface of at most 0.15 nm rms and a flatness of at most 100 nm, with a view to obtaining a high reflectance and printing precision in a photomask after pattern formation.

The dimensions, the thickness and the like of the substrate 11 are properly determined according to the designed values of a mask or the like. In Examples described hereinafter, a $SiO_2$—$TiO_2$ glass having outer dimensions of 6 inch (152.4 mm) square and a thickness of 0.25 inch (6.3 mm) was used.

It is preferred that no defects are present on the surface of the substrate 11 on a side where the reflective layer 12 is formed. However, even when defects are present, it is preferred that the depth of the concave defects and the height of the convex defects are at most 2 nm and that the half value width of the concave defects and the convex defects is at most 60 nm, in order that no phase defects are formed by the concave defects and/or the convex defects.

The reflective layer 12 is not particularly limited so long as it has properties as desired as a reflective layer for an EUV mask blank. The property that is particularly required for the reflective layer 12 is that it is a film having a high EUV light reflectance. Specifically, when the reflective layer 12 is irradiated with a ray in the wavelength range of the EUV light, the maximum reflectance to light having a wavelength in the vicinity of 13.5 nm is preferably at least 60%, more preferably at least 65%. Further, even when a protective layer 13 or a low reflective layer 15 is formed on the reflective layer 12, the maximum reflectance to light having a wavelength in the vicinity of 13.5 nm is preferably at least 60%, more preferably at least 65%.

As the reflective layer 12, usually a reflective multilayer film having high refractive index layers and low refractive index layers alternately stacked several times is used, which achieves a high EUV light reflectance. In the reflective multilayer film for the reflective layer 12, Mo is widely used for the high refractive index layers and Si is widely used for the low refractive index layers. That is, a Mo/Si reflective multilayer film is most commonly used. However, the reflective multilayer film is not limited thereto, and a Ru/Si reflective multilayer film, a Mo/Be reflective multilayer film, a Mo compound/Si compound reflective multilayer film, a Si/Mo/Ru reflective multilayer film, a Si/Mo/Ru/Mo reflective multilayer film or a Si/Ru/Mo/Ru reflective multilayer film may also be used.

The thicknesses and the number of repeating units of the layers constituting the reflective multilayer film for the reflective layer 12 are properly selected depending upon the film material used and the EUV light reflectance required for the reflective layer. In the case of a Mo/Si reflective layer as an example, in order that the reflective layer 12 has a maximum EUV light reflectance of at least 60%, Mo layers having a thickness of $2.3\pm0.1$ nm and Si layers having a thickness of $4.5\pm0.1$ nm are stacked with a number of repeating units of from 30 to 60 to form the reflective multilayer film.

The respective layers constituting the reflective multilayer film for the reflective layer 12 may be formed to have desired thicknesses by a known film deposition method such as magnetron sputtering or ion beam sputtering. For example, in the case of forming a Si/Mo reflective multilayer film by ion beam sputtering, it is preferred to deposit a Si film so as to have a thickness is of 4.5 nm, using a Si target as the target and an Ar gas (having a gas pressure of $1.3\times10^{-2}$ Pa to $2.7\times10^{-2}$ Pa) as the sputtering gas, with an ion acceleration voltage of from 300 to 1,500 V at a deposition rate of from 0.03 to 0.30 nm/sec, and then to form a Mo film so as to have a thickness of 2.3 nm, using a Mo target as the target and an Ar gas (having a gas pressure of from $1.3\times10^{-2}$ Pa to $2.7\times10^{-2}$ Pa) as the sputtering gas with an ion acceleration voltage of from 300 to 1,500 V at a deposition rate of from 0.03 to 0.30 nm/sec. By stacking Si films and Mo films in 40 to 50 cycles, each of the cycles comprising the above steps, the Si/Mo reflective multilayer film is deposited.

The outermost layer of the reflective multilayer film for the reflective layer 12 is preferably a layer made of a material which is hardly oxidized, so as to prevent the surface of the reflective layer 12 from being oxidized. The layer made of a material which is hardly oxidized, serves as a capping layer for the reflective layer 12. As a specific example of the layer made of a material hardly oxidized, which serves as the capping layer, a Si layer may be mentioned. In a case where the reflective multilayer film for the reflective layer 12 is a Si/Mo film, the outermost layer can serve as the capping layer, if it is a Si layer. In such a case, the film thickness of the capping layer is preferably $11.0\pm1.0$ nm.

The protective layer 13 is formed for the purpose of protecting the reflective layer 12 from being damaged by an etching process during pattern formation on the absorber layer 14 by etching process, usually by dry etching process. Thus, as a material of the protective layer 13, a material which is less susceptible to the etching process for the absorber layer 14 i.e. which presents a lower etching rate than that of the absorber layer 14 and which is hardly damaged by the etching process, is selected. A material which satisfies these requirements may, for example, be Cr, Al, Ru or Ta, or a nitride thereof, $SiO_2$, $Si_3N_4$ or $Al_2O_3$, or a mixture thereof. Among them, preferred is a Ru compound (Ru or RuB), CrN or $SiO_2$, and particularly preferred is a Ru compound (Ru or RuB).

The thickness of the protective layer 13 is preferably from 1 to 60 nm.

The protective layer 13 is formed by a known film deposition method such as magnetron sputtering or ion beam sputtering. In the case of forming a Ru film by magnetron sputtering, it is preferred to deposit the film so as to have a thickness of from 2 to 5 nm, using a Ru target as the target and an Ar gas (having a gas pressure of from $1.0 \times 10^{-1}$ Pa to $10 \times 10^{-1}$ Pa) as the sputtering gas with an electric power applied of from 30 W to 500 W at a deposition rate of from 5 to 50 nm/min.

The property that is particularly required for the absorber layer 14 is that it has a very low EUV light reflectance. Specifically, when the absorber layer 14 is irradiated with a ray in the wavelength range of the EUV light, the maximum reflectance to light having a wavelength in the vicinity of 13.5 nm is preferably at most 0.5%, more preferably at most 0.1%.

In order to achieve the above properties, the absorber layer is preferably made of a material having a high absorption coefficient to EUV light.

The absorber layer 14 in the EUV mask blank 1 of the present invention contains tantalum (Ta), boron (B), silicon (Si) and nitrogen (N) in the after-mentioned specific ratio, whereby the above properties are achieved.

The B content in the absorber layer 14 is at least 1 at % and less than 5 at %. Heretofore, in a case where a film containing Ta and B (TaB film, TaBN film, TaBO film, TaBNO film) is used as the absorber layer, in order that the film is in an amorphous state, the B content has to be at least 5 at %. However, as described above, if the B content in the film is at least 5 at %, such problems tend to arise that the deposition rate is low, and it is difficult to control the B content in the film and the film thickness.

In the EUV mask blank 1 of the present invention, by the absorber layer 14 containing Ta, B, Si and N in a specific ratio, the absorber layer 14 is in an amorphous state even when the B content in the absorber layer 14 is less than 5 at %.

If the B content in the absorber layer 14 is less than 1 at %, it is required to increase the amount of Si so as to make the absorber layer 14 be in an amorphous state. Specifically, the Si content has to be higher than 25 at %, whereby the thickness of the absorber layer required to make the EUV light reflectance be at most 0.5% tends to increase, such being unfavorable. If the B content in the absorber layer 14 is higher than 5 at %, the above problems such as a low deposition rate tend to arise.

The B content in the absorber layer 14 is more preferably from 1 to 4.5 at %, furthermore preferably from 1.5 to 4 at %. When it is from 1.5 to 4 at %, film deposition will be stably carried out and in addition, the absorber layer will be excellent in smoothness or the like which is a property required for a mask, and stable film deposition and properties are well balanced, such being very favorable.

The Si content in the absorber layer 14 is from 1 to 25 at %. If the Si content in the absorber layer 14 is less than 1 at %, the absorber layer 14 will not be in an amorphous state. Since Si is a material which presents a low absorption coefficient to EUV light, if the Si content in the absorber layer 14 exceeds 25 at %, the thickness of the absorber layer required to make the EUV light reflectance be at most 0.5% tends to increase, such being unfavorable.

The Si content in the absorber layer 14 is more preferably from 1 to 20 at %, furthermore preferably from 2 to 12 at %.

In the absorber layer 14, components other than B and Si are Ta and N. In the absorber layer 14, the compositional ratio of Ta to N (Ta:N) is from 8:1 to 1:1. If the proportion of Ta is higher than the above compositional ratio, the reflectance to light in the wavelength range of pattern inspection light is not sufficiently low. On the other hand, if the proportion of N is higher than the above compositional ratio, the film density tends to be low, the absorption coefficient to EUV light tends to be low, and no sufficient absorption properties to EUV light will be obtained. Further, the acid resistance of the absorber layer 14 tends to be low.

The Ta content in the absorber layer 14 is more preferably from 50 to 90 at %, furthermore preferably from 60 to 80 at %. The N content in the absorber layer 14 is more preferably from 5 to 30 at %, furthermore preferably from 10 to 25 at %.

The absorber layer 14 may contain an element other than Ta, B, Si and N, but it is required to have properties as a mask blank such as absorption properties to EUV light.

The absorber layer is in an amorphous state by the above constitution. In this Description, "being an amorphous state" includes a microcrystal state in addition to an amorphous structure with no crystal structure at all. When the absorber layer 14 is an amorphous structure film or a microcrystal structure film, the surface of the absorber layer 14 is excellent in smoothness.

In the EUV mask blank 1 of the present invention, the surface roughness on the surface of the absorber layer 14 is at most 0.5 nm rms, since the absorber layer 14 is an amorphous structure film or a microcrystal structure film. If the surface roughness on the surface of the absorber layer 14 is great, the edge roughness of a pattern formed on the absorber layer 14 tends to be significant, thus deteriorating the dimensional accuracy of the pattern. Since the influence of the edge roughness tends to increase as the pattern becomes fine, the surface of the absorber layer 14 is required to be smooth.

When the surface roughness on the surface of the absorber layer 14 is at most 0.5 nm rms, the surface of the absorber layer 14 is sufficiently smooth, and accordingly the dimensional accuracy of the pattern will not be deteriorated by the influence of the edge roughness. The surface roughness on the surface of the absorber layer 14 is more preferably at most 0.4 nm rms, furthermore preferably at most 0.3 nm rms.

The crystal state of the absorber layer 14 being amorphous i.e. in the absorber layer 14 having an amorphous structure or a microcrystal structure can be confirmed by X-ray diffraction (XRD). When the crystal state of the absorber layer 14 is an amorphous structure or a microcrystal structure, no sharp peak will be observed on a diffraction peak obtainable by an XRD measurement.

The thickness of the absorber layer 14 is preferably from 50 to 100 nm. The absorber layer 14 having the above structure can be formed by a known film deposition method, e.g. sputtering such as magnetron sputtering or ion beam sputtering. In the case of magnetron sputtering, the absorber layer 14 can be formed by any of the following methods (1) to (3).

(1) Using a Ta target, a B target and a Si target, the respective targets are simultaneously discharged in an atmosphere of nitrogen ($N_2$) diluted with argon (Ar) to form the absorber layer 14.

(2) Using a TaB compound target and a Si target, these targets are simultaneously discharged in an atmosphere of nitrogen diluted with argon to form the absorber layer 14.

(3) Using a TaBSi compound target, the target comprising these three elements combined is discharged in an atmosphere of nitrogen diluted with argon to form the absorber layer 14. Among the above-described methods, in the methods ((1) and (2)) of discharging two or more targets simultaneously, the composition of the absorber layer 14 to be formed can be controlled by adjusting the electric power applied to the respective targets.

Among the above methods, the methods (2) and (3) are preferred with a view to avoiding unstable discharge or dispersion of the composition and the thickness of the film, and the method (3) is particularly preferred. The TaBSi compound target particularly preferably has a composition of Ta=50 to 94 at %, Si=5 to 30 at % and B=1 to 20 at %, with a view to avoiding unstable discharge and the dispersion of the composition and the thickness of the film.

To form the absorber layer 14 by the above exemplified method, specifically, film deposition is carried out under the following film deposition conditions.

Method (2) Using TaB Compound Target and Si Target

Sputtering gas: gas mixture of Ar and $N_2$ ($N_2$ gas concentration: 3 to 80 vol %, preferably 5 to 30 vol %, more preferably 8 to 15 vol %, gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied (for each target): 30 to 1,000 W, preferably 50 to 750 W, more preferably 80 to 500 W Deposition rate: 2.0 to 60 nm/min, preferably 3.5 to 45 nm/min, more preferably 5 to 30 nm/min Method (3) Using TaBSi Compound Target Sputtering gas: gas mixture of Ar and $N_2$ ($N_2$ gas concentration: 3 to 80 vol %, preferably 5 to 30 vol %, more preferably 8 to 15 vol %, gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied: 30 to 1,000 W, preferably 50 to 750 W, more preferably 80 to 500 W Deposition rate: 2.0 to 60 nm/min, preferably 3.5 to 45 nm/min, more preferably 5 to 30 nm/min The low reflective layer 15 is constituted by a low reflective film to inspection light to be used for inspection of a mask pattern. At the time of preparation of an EUV mask, after a pattern is formed on the absorber layer, the EUV mask is inspected whether the pattern is formed as designed. For inspection of the mask pattern, an inspection machine usually employing a light at a wavelength of about 257 nm as inspection light is used. That is, the EUV mask is inspected by the difference in the reflectance to this light at a wavelength of about 257 nm, specifically by the difference in the reflectance between on the exposed face from which the absorber layer 14 is removed by the pattern formation and on the surface of the absorber layer 14 remaining without being removed by pattern formation. The former face corresponds to the surface of the reflective layer 12 or the surface of the protective layer 13, usually the surface of the protective layer 13. Thus, if the difference in the reflectance between on the surface of the protective layer 13 and on the surface of the absorber layer 14 to light at a wavelength of the inspection light is small, the contrast tends to be poor at the time of inspection and accurate inspection will not be conducted.

The absorber layer 14 having the above-described structure has a very low EUV light reflectance and has excellent properties as the absorber layer for the EUV mask blank 1, but with respect to the wavelength of the inspection light, its light reflectance is not necessarily sufficiently low. Thus, the difference between the reflectance on the surface of the absorber layer 14 and the reflectance on the surface of the protective layer 13 at a wavelength of the inspection light is small, and no sufficient contrast may be obtained at the time of inspection. If no sufficient contrast can be obtained at the time of inspection, defects of the pattern cannot sufficiently be judged at the time of mask inspection, and the defect test cannot be conducted accurately.

In the EUV mask blank 1 of the present invention, by forming a low reflective layer 15 to inspection light on the absorber layer 14, a favorable contrast will be obtained at the time of inspection, that is, the light reflectance at the wavelength of the inspection light is very low. Specifically, when the low reflective layer 15 is irradiated with a ray in the wavelength range of the inspection light, the maximum light reflectance at the wavelength of the inspection light is preferably at most 15%, more preferably at most 10%, furthermore preferably at most 5%.

When the low reflective layer 15 has a light reflectance of at most 15% at a wavelength of the inspection light, a favorable contrast at the time of inspection will be obtained. Specifically, the contrast between the reflected light at a wavelength of the inspection light on the surface of the protective layer 13 and the reflected light at a wavelength of the inspection light on the surface of the low reflective layer 15, is at least 40%.

In this Description, the contrast can be determined by the following formula.

$$\text{Contrast}(\%) = ((R_2 - R_1)/(R_2 + R_1)) \times 100$$

Figure 2:
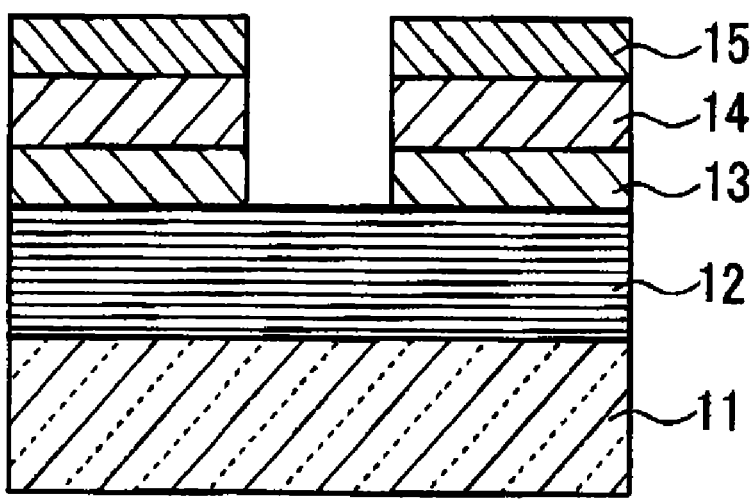
FIG. 2 illustrates a state where a pattern is formed on an absorber layer 14 (and a low reflective layer 15) of an EUV mask blank 1 shown in FIG. 1.

$R_2$ at a wavelength of the inspection light is the reflectance on the surface of the protective layer 13, and $R_1$ is the reflectance on the surface of the low reflective layer 15. The above $R_1$ and $R_2$ are measured in a state where a pattern is formed on the absorber layer 14 (and the low reflective layer 15) of the EUV mask blank 1 shown in FIG. 1, as shown in FIG. 2. The above $R_2$ is a value measured on the surface of the reflective layer 12 or on the surface of the protective layer 13 exposed to the outside, from which the absorber layer 14 and the low reflective layer 15 are removed by pattern formation, and $R_1$ is a value measured on the surface of the low reflective layer 15 remaining without being removed by pattern formation.

In the present invention, the contrast represented by the above formula is more preferably at least 45%, furthermore preferably at least 60%, particularly preferably at least 80%.

The low reflective layer 15 is preferably made of a material presenting a lower reflectance at a wavelength of the inspection light than that of the absorber layer 14, and it preferably has an amorphous structure in order to achieve the above properties.

According to a first embodiment of the low reflective layer 15 of the EUV mask blank 1 of the present invention, the low reflective layer 15 contains Ta, B, Si and oxygen (O) with the after-mentioned specific ratio to achieve the above properties.

The B content of the low reflective layer 15 is at least 1 at % and less than 5 at %. As described above with respect to the absorber layer, in a case where a film containing Ta and B (TaB film, TaBN film, TaBO film or TaBNO film) is used, it is required that the B content in the film is at least 5 at % in order that the film is in an amorphous state. With respect to the EUV mask blank 1 of the present invention, by the low reflective layer 15 containing tantalum (Ta), boron (B), silicon (Si) and oxygen (O) in a specific ratio, the low reflective layer 15 is in an amorphous state even when the B content in the layer is less than 5 at %.

If the B content in the low reflective layer 15 is less than 1 at %, it is necessary to increase the Si amount in order that the low reflective layer 15 is in an amorphous state. Specifically, the Si content is required to be higher than 25 at %, and the total thickness of the absorber layer 14 and the low reflective layer 15 required to make the EUV light reflectance be at most 0.5% tends to be thick, depending upon the Si content and the thickness of the absorber layer 14. If the B content in the low reflective layer 15 is at least 5 at %, the same problems as described for the absorber layer 14 such as a low deposition rate tend to arise.

The B content in the low reflective layer 15 is more preferably from 1 to 4.5 at %, more preferably from 1.5 to 4 at %.

The Si content in the low reflective layer 15 is from 1 to 25 at %. If the Si content in the low reflective layer 15 is less than 1 at %, the low reflective layer 15 will not be in an amorphous state. Since Si is a material which presents a low absorption coefficient to the EUV light, if the Si content in the low reflective layer 15 exceeds 25 at %, the total thickness of the absorber layer 14 and the low reflective layer 15 required to make the EUV light reflectance be at most 0.5% tends to be thick, depending upon the Si content and the thickness of the absorber layer 14.

The Si concentration in the low reflective layer 15 is more preferably from 1 to 20 at %, furthermore preferably from 2 to 10 at %.

In the low reflective layer 15, components other than B and Si are Ta and O. The compositional ratio of Ta to O (Ta:O) in the low reflective layer 15 is from 7:2 to 1:2. If the proportion of Ta is higher than the above compositional ratio, the reflectance of light in the wavelength range of pattern inspection light is not sufficiently low. On the other hand, if the proportion of O is higher than the above compositional ratio, the insulating properties tend to be high, whereby charge up may occur by irradiation with electron rays. The film density tends to decrease, the insulating properties of the low reflective layer 15 tend to increase, and charge up is likely to occur at the time of electron beam lithography on the low reflective layer 15. Here, the low reflective layer 15 is thinner than the absorber layer 14, and charge up is relatively less likely to occur. Accordingly, the upper limit of the O content is high as compared with the absorber layer 14.

The compositional ratio of Ta to O (Ta:O) in the low reflective layer 15 is preferably from 7:2 to 1:1, more preferably from 2:1 to 1:1.

In the EUV mask blank 1 of the present invention, the low reflective layer 15 may further contain N in addition to Ta, B, Si and O.

Namely, in the EUV mask blank 1 of the present invention, according to a second embodiment of the low reflective layer 15, the low reflective layer 15 contains Ta, B, Si, O and N in the after-mentioned specific ratio to achieve the above properties.

It is considered that the smoothness on the surface of the low reflective layer 15 improves by the low reflective layer 15 containing N.

Hereinbelow, in this Description, the first embodiment of the low reflective layer is described as a low reflective layer (TaBSiO) and the second embodiment is described as a low reflective layer (TaBSiON) to distinguish them. Although TaBSiO as a material of the low reflective layer is an insulant, as the low reflective layer is usually thick, substantially no problem of the charge up at the time of electron beam lithography will arise.

The B content in the low reflective layer (TaBSiON) is at least 1 at % and less than 5 at %. If the B content in the low reflective layer 15 is less than 1 at %, it is necessary to increase the Si amount in order that the low reflective layer 15 is in an amorphous state. Specifically, the Si content has to be higher than 25 at %, and the total thickness of the absorber layer 14 and the low reflective layer 15 required to make the EUV light reflectance be at most 0.5% tends to be thick, depending upon the Si content and the thickness of the absorber layer 14, such being unfavorable. If the B content in the low reflective layer 15 is at least 5 at %, the same problems as described for the absorber layer 14 such as a low deposition rate tend to arise.

The B content in the low reflective layer (TaBSiON) is more preferably from 1 to 4.5 at %, furthermore preferably from 2 to 4.0 at %.

The Si content in the low reflective layer (TaBSiON) is from 1 to 25 at %. If the Si content in the low reflective layer (TaBSiON) is less than 1 at %, the low reflective layer (TaBSiON) will not be in an amorphous state. Since Si is a material which presents a low absorption coefficient to EUV light, if the Si content in the low reflective layer 15 exceeds 25 at %, the total thickness of the absorber layer 14 and the low reflective layer 15 required to make the EUV light reflectance be at most 0.5% tends to be thick, depending upon the Si content and the thickness of the absorber layer 14.

The Si content in the low reflective layer (TaBSiON) is more preferably from 1 to 20 at %, furthermore preferably from 2 to 10 at %.

In the low reflective layer (TaBSiON), components other than B and Si are Ta, O and N. In the low reflective layer (TaBSiON), the compositional ratio of Ta to O and N (Ta:(O+N)) is from 7:2 to 1:2. If the proportion of Ta is higher than the above compositional ratio, the reflectance to light in the wavelength range of pattern inspection light is not sufficiently low. On the other hand, if the proportion of O and N is higher than the above compositional ratio, such problems tend to arise that the acid resistance of the low reflective layer (TaBSiON) decreases, and the insulating properties of the low reflective layer (TaBSiON) increases to cause charge up at the time of electron beam lithography on the low reflective layer (TaBSiON).

The compositional ratio of Ta to O and N (Ta:(O+N)) in the low reflective layer (TaBSiON) is preferably from 7:2 to 1:1, more preferably from 2:1 to 1:1.

The low reflective layer (TaBSiO) or (TaBSiON) having the above structure is in an amorphous state and has a surface excellent in smoothness. Specifically, the surface roughness on the surface of the low reflective layer (TaBSiO) or (TaBSiON) is at most 0.5 nm rms.

As described above, the surface of the absorber layer is required to be smooth, in order to prevent deterioration of the dimensional accuracy of the pattern by the influence of the edge roughness. Since the low reflective layer (TaBSiO) or (TaBSiON) is formed on the absorber layer, its surface is required to be smooth from the same reason.

When the surface roughness on the surface of the low reflective layer (TaBSiO) or (TaBSiON) is at most 0.5 nm rms, the dimensional accuracy of the pattern will not be deteriorated by the influence of the edge roughness, since the surface of the low reflective layer (TaBSiO) or (TaBSiON) is sufficiently smooth. The surface roughness on the surface of the low reflective layer 15 is more preferably at most 0.4 nm rms, furthermore preferably at most 0.3 nm rms.

The low reflective layer preferably contains N, that is, the low reflective layer (TaBSiON) is more favorable than the low reflective layer (TaBSiO) in view of smoothness.

The low reflective layer (TaBSiO) or (TaBSiON) being in an amorphous state, i.e. the layer having an amorphous structure or a microcrystal structure, can be confirmed by X-ray diffraction (XRD). When the crystal structure of the low reflective layer (TaBSiO) or (TaBSiON) is an amorphous structure or a microcrystal structure, no sharp peak will be observed in a diffraction peak obtainable by XRD measurement.

In the case of forming the low reflective layer (TaBSiO) or (TaBSiON) on the absorber layer, the total thickness of the absorber layer and the low reflective layer (TaBSiO) or (TaB- SiON) is preferably from 55 to 130 nm. Further, the low reflective layer (TaBSiO) or (TaBSiON) is preferably thinner than the absorber layer since the EUV light absorption properties of the absorber layer may decrease if the low reflective layer (TaBSiO) or (TaBSiON) is thicker than the absorber layer. Accordingly, the thickness of the low reflective layer (TaBSiO) or (TaBSiON) is preferably from 5 to 30 nm, more preferably from 10 to 20 nm.

The low reflective layer (TaBSiO) or (TaBSiON) can be formed by a known film deposition method, e.g. sputtering such as magnetron sputtering or ion beam sputtering. In the case of magnetron sputtering, the low reflective layer (TaBSiO) can be formed by any of the following methods (1) to (3).

(1) Using a Ta target, a B target and a Si target, the respective targets are simultaneously discharged in an atmosphere of oxygen ($O_2$) diluted with argon (Ar) to form the low reflective layer (TaBSiO).

(2) Using a TaB compound target and a Si target, these targets are simultaneously discharged in an atmosphere of oxygen diluted with argon to form the low reflective layer (TaBSiO).

(3) Using a TaBSi compound target, the target comprising these three elements combined is discharged in an atmosphere of oxygen diluted with argon to form the low reflective layer (TaBSiO).

Among the above described methods, in the methods ((1) and (2)) of discharging two or more targets simultaneously, the composition of the low reflective layer (TaBSiO) to be formed can be controlled by adjusting the electric power applied to the respective targets.

Among the above methods, the methods (2) and (3) are preferred with a view to avoiding unstable discharge or the discharge of the composition and the thickness of the film, and the method (3) is particularly preferred. The TaBSi compound target particularly preferably has a composition of Ta=50 to 94 at %, Si=5 to 30 at % and B=1 to 20 at %, with a view to avoiding unstable discharge and the dispersion of the composition and the thickness of the film.

As described above, in the case of film deposition using a Ta target and a B target, since the B target has a high resistance and is a light element, its deposition rate is at most $\frac{1}{10}$ in many cases as compared with the Ta target. Thus, in order to add B in a content (at least 5 at %) required to make the crystal structure of the film be amorphous as disclosed in Patent Document 1, it is necessary to lower the deposition rate of the Ta target, which remarkably decreases the production efficiency and is unfavorable.

On the other hand, in the method using a TaB compound target, in a case where the compound target containing 20 at % of B and 80 at % of Ta is used for example, the maximum content of B actually added in the film is about 6 at %, and it is difficult to control the B content in the film to be at least 5 at %. Further, when N is added, the B content in the film is at most 4 at %, and the crystal structure of the film cannot be amorphous.

In order to solve the problem, an increase in the B content in the film is expected by further increasing the B content in the TaB compound target (for example, B: 50 at % and Ta: 50 at %). However, as the B content in the TaB target increases, the resistance of the TaB target tends to increase, and the discharge tends to be unstable and the deposition rate tends to be low. Unstable discharge may cause a dispersion of the composition or the thickness of the film or in some cases, film deposition cannot be conducted.

It is the above TaBSi compound target that solves these problems. By using it, productivity of the TaBSiN film can be improved, and it is possible to suppress the dispersion of the composition and the thickness as far as possible.

In a case where the low reflective layer (TaBSiON) is formed, the same procedure as above is carried out in an atmosphere of an oxygen/nitrogen gas mixture diluted with argon instead of in an atmosphere of oxygen diluted with argon. By such a procedure, in the same manner as described above, the productivity of the TaBSiON film can be improved, and it is possible to suppress the dispersion of the composition and the thickness as far as possible.

To form the low reflective layer (TaBSiO) by the above method, specifically, film deposition is carried out under the following deposition conditions.

Method (2) Using TaB Compound Target and Si Target

Sputtering gas: gas mixture of Ar and $O_2$ ($O_2$ gas concentration: 3 to 80 vol %, preferably 5 to 30 vol %, more preferably 8 to 15 vol %, gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied (for each target): 30 to 1,000 W, preferably 50 to 750 W, more preferably 80 to 500 W Deposition rate: 2.0 to 60 nm/min, preferably 3.5 to 45 nm/min, more preferably 5 to 30 nm/min Method (3) Using TaBSi Compound Target Sputtering gas: gas mixture of Ar and $O_2$ ($O_2$ gas concentration: 3 to 80 vol %, preferably 5 to 30 vol %, more preferably 8 to 15 vol %, gas pressure: $1.0 \times 10^{-1}$ Pa to $10 \times 10^{-1}$ Pa, preferably $1.0 \times 10^{-1}$ Pa to $5 \times 10^{-1}$ Pa, more preferably $1.0 \times 10^{-1}$ Pa to $3 \times 10^{-1}$ Pa)

Electric power applied: 30 to 1,000 W, preferably 50 to 750 W, more preferably 80 to 500 W Deposition rate: 2.0 to 50 nm/min, preferably 2.5 to 35 nm/min, more preferably 5 to 25 nm/min To form the low reflective layer (TaBSiON) by the above method, specifically, film deposition is carried out under the following film deposition conditions.

Method (2) Using TaB Compound Target and Si Target

Sputtering gas: gas mixture of Ar, $O_2$ and $N_2$ ($O_2$ gas concentration: 5 to 30 vol %, $N_2$ gas concentration: 5 to 30 vol %, preferably $O_2$ gas concentration: 6 to 25 vol %, $N_2$ gas concentration: 6 to 25 vol %, more preferably $O_2$ gas concentration: 10 to 20 vol %, $N_2$ gas concentration: 15 to 25 vol %; gas pressure: $1.0 \times 10^{-2}$ Pa to $10 \times 10^{-2}$ Pa, preferably $1.0 \times 10^{-2}$ Pa to $5 \times 10^{-2}$ Pa, more preferably $1.0 \times 10^{-2}$ Pa to $3 \times 10^{-2}$ Pa)

Electric power applied (for each target): 30 to 1,000 W, preferably 50 to 750 W, more preferably 80 to 500 W Deposition rate: 2.0 to 50 nm/min, preferably 2.5 to 35 nm/min, more preferably 5 to 25 nm/min Method (3) Using TaBSi Compound Target Sputtering gas: gas mixture of Ar, $O_2$ and $N_2$ ($O_2$ gas concentration: 5 to 30 vol %, $N_2$ gas concentration: 5 to 30 vol %, preferably $O_2$ gas concentration: 6 to 25 vol %, $N_2$ gas concentration: 6 to 25 vol %, more preferably $O_2$ gas concentration: 10 to 20 vol %, $N_2$ gas concentration: 15 to 25 vol %; gas pressure: $1.0 \times 10^{-2}$ Pa to $10 \times 10^{-2}$ Pa, preferably $1.0 \times 10^{-2}$ Pa to $5 \times 10^{-2}$ Pa, more preferably $1.0 \times 10^{-2}$ Pa to $3 \times 10^{-2}$ Pa)

Electric power applied: 30 to 1,000 W, preferably 50 to 750 W, more preferably 80 to 500 W Deposition rate: 2.0 to 50 nm/min, preferably 2.5 to 35 nm/min, more preferably 5 to 25 nm/min In the present invention, it is preferred to form the low reflective layer 15 on the absorber layer 14 in the EUV mask blank 1 of the present invention because the wavelength of the pattern inspection light and the wavelength of the EUV light are different. Thus, in a case where EUV light (in the vicinity of 13.5 nm) is used as the pattern inspection light, it is considered that it is not necessary to form the low reflective layer 15 on the absorber layer 14. The wavelength of the inspection light tends to shift toward a short wavelength side along with a reduction in the pattern dimension, and it is considered to shift to 193 nm or further to 13.5 nm in future. It is considered that it is not required to form the low reflective layer 15 on the absorber layer 14 when the wavelength of the inspection light is 13.5 nm.

The EUV mask blank 1 of the present invention may have a functional film known in the field of the EUV mask blank, in addition to the reflective layer 12, the protective layer 13, the absorber layer 14 and the low reflective layer 15. Specific examples of such a functional film include a highly dielectric coating to be applied on the back side of the substrate to accelerate electrostatic chucking of the substrate. The back side of the substrate represents a face opposite to the face on which the reflective layer 12 is formed in the substrate 11 in FIG. 1. The electrical conductivity of a constituent material and the thickness of the highly dielectric coating to be applied on the back side of the substrate for the above purpose are selected so that the sheet resistance will be at most $100\Omega/\square$. As the constituent material of the highly dielectric coating can be widely selected from ones disclosed in known literature. For example, a highly dielectric coating as disclosed in JP-A-2003-501823, specifically, a coating comprising silicon, TiN, molybdenum, chromium or TaSi can be applied. The thickness of the highly dielectric coating may, for example, be from 10 to 1,000 nm.

The highly dielectric coating can be formed by a known film deposition method, e.g. sputtering such as magnetron sputtering or ion beam sputtering, a CVD method, a vacuum deposition method or a electrolytic plating method.

EXAMPLES

Now, the present invention will be described in further detail with reference to Examples. However, it should be understood that the present invention is by no means restricted to such specific Examples.

Example 1

In this Example, an EUV mask blank 1 shown in FIG. 1 was prepared. In the EUV mask blank 1 in Example 1, no low reflective layer 15 was formed on an absorber layer 14.

As a substrate 11 for film deposition, a $SiO_2$—$TiO_2$ glass substrate (outer dimensions of 6 inch (152.4 mm) square and a thickness of 6.3 mm) was used. This glass substrate has a coefficient of thermal expansion of $0.2 \times 10^{-7}/°C.$, a Young's modulus of 67 GPa, a Poisson's ratio of 0.17 and a specific rigidity of $3.07 \times 10^7$ $m^2/s^2$. The glass substrate was polished so as to have a smooth surface with rms of at most 0.15 nm and a flatness of at most 100 nm.

On the back side of the substrate 11, a highly dielectric coating with a sheet resistance of $100\Omega/\square$ was applied by depositing a Cr film with a thickness of 100 nm by magnetron sputtering.

The substrate 11 (outer dimensions of 6 inch (152.4 mm) square and a thickness of 6.3 mm) was fixed to a conventional electrostatic chuck in a flat plate shape using the formed Cr film, and a cycle comprising alternately depositing Si films and Mo films on the surface of the substrate 11 by ion beam sputtering was repeated 40 times to form a Si/Mo reflective multilayer film (reflective layer 12) having a total film thickness of 272 nm ((4.5 nm+2.3 nm)×40).

Further, on the Si/Mo reflective multilayer film (reflective layer 12), a Ru film (film thickness 2.5 nm) was deposited by ion beam sputtering to form a protective layer 13.

The deposition conditions for the Si films, the Mo films and the Ru film are as follows.
(Deposition Conditions for Si Films)
Target: Si target (doped with boron)
Sputtering gas: Ar gas (gas pressure 0.02 Pa)
Voltage: 700 V
Deposition rate: 0.077 nm/sec
Film thickness: 4.5 nm
(Deposition Conditions for Mo Films)
Target: Mo target
Sputtering gas: Ar gas (gas pressure 0.02 Pa)
Voltage: 700 V
Deposition rate: 0.064 nm/sec
Film thickness: 2.3 nm
(Deposition Conditions for Ru Film)
Target: Ru target
Sputtering gas: Ar gas (gas pressure 0.02 Pa)
Voltage: 500 V
Deposition rate: 0.023 nm/sec
Film thickness: 2.5 nm Then, a TaBSiN layer was formed as an absorber layer 14 on the protective layer 13 by magnetron sputtering to obtain an EUV mask blank 1 comprising the substrate 11 and the reflective layer 12, the protective layer 13 and the absorber layer 14 formed in this order on the substrate.

The deposition conditions for the TaBSiN layer are as follows.
(Deposition Conditions for TaBSiN Layer)
Target: TaBSi compound target (compositional ratio: Ta 80 at %, B 10 at %, Si 10 at %)
Sputtering gas: gas mixture of Ar and $N_2$ (Ar: 86 vol %, $N_2$: 14 vol %, gas pressure: 0.3 Pa)
Electric power applied: 150 W
Deposition rate: 0.12 nm/sec
Film thickness: 60 nm The following evaluations (1) to (4) were carried out with respect to the absorber layer in the EUV mask blank obtained by the above procedure.
(1) Film Composition The composition of the absorber layer (TaSiBN film) was measured by using an X-ray photoelectron spectrometer (manufactured by PERKIN ELEMER-PHI, number 5,500). The compositional ratio (at %) of the absorber layer was Ta:B:Si:N=70:3:10:17 (a Ta content of 70 at %, a B content of 3 at %, a Si content of 10 at %, a N content of 17 at %).
(2) Crystal Structure The crystal structure of the absorber layer (TaSiBN film) was confirmed by an X-ray diffractmeter (manufactured by Rigaku Corporation). The crystal structure of the absorber layer was confirmed to be an amorphous structure or a microcrystal structure since no sharp peak was observed in the obtained diffraction peak.
(3) Surface Roughness The surface roughness of the absorber layer (TaSiBN film) was confirmed by using an atomic force microscope (manufactured by Seiko Instruments Inc., number SPI3800) in accordance with JIS-B0601 (1994). The surface roughness of the absorber layer was 0.15 nm rms.
(4) Resistance The resistance of the absorber layer (TaSiBN film) was measured by using a four-point probe measuring apparatus: Loresta AP MCP-T400, manufactured by Mitsubishi Petrochemical Co., Ltd., and as a result, it was $2.0 \times 10^{-4}$ $\Omega \cdot cm$.

Example 2

In this Example, an EUV mask blank 1 comprising a low reflective layer 15 formed on an absorber layer 14 was prepared.

In this Example, the same operation as in Example 1 was carried out until the absorber layer 14 was formed on the protective layer 13. On the absorber layer 14, a TaBSiON film was formed as a low reflective layer to inspection light having a wavelength of 257 nm by magnetron sputtering. The compositional ratio (at %) of the low reflective layer was measured in the same manner as in Example 1 and as a result, Ta:B:Si:N:O=40:3:10:10:37.

The deposition conditions for the TaBSiON film are as follows.

(Deposition Conditions for TaBSiON Film)
Target: TaBSi target (compositional ratio: Ta 80 at %, B 10 at %, Si 10 at %)
Sputtering gas: gas mixture of Ar, $N_2$ and $O_2$ (Ar: 60 vol %, $N_2$: 20 vol %, $O_2$: 20 vol %, gas pressure: 0.3 Pa)
Electric power applied: 150 W
Deposition rate: 0.18 nm/sec
Film thickness: 10 nm The following evaluations (5) and (6) were carried out with respect to the low reflective layer in the EUV mask blank obtained by the above procedure.

(5) Reflection Properties (Evaluation of Contrast)

In Example 1, after the protective layer (Ru layer) 13 was formed, the reflectance to pattern inspection light (wavelength 257 nm) on the surface of the protective layer 13 was measured by a spectrophotometer. Further, in Example 2, after the low reflective layer (TaBSiON) 15 was formed, the reflectance to pattern inspection light on the surface of the low reflective layer was measured. As a result, the reflectance was 60.0% on the surface of the protective layer 13 and the reflectance was 6.9% on the surface of the low reflective layer 15. The contrast was determined from the above results and from the above-described formula and as a result, it was 79.4%.

With respect to the obtained EUV mask blank 1, the low reflective layer 15 was irradiated with EUV light (wavelength 13.5 nm) to measure the reflectance to the EUV light. As a result, the reflectance to the EUV light was 0.4%, and the EUV mask blank 1 was confirmed to be excellent in the EUV absorption properties.

(6) Etching Properties

The etching properties were evaluated by the following method instead of evaluation using the EUV mask blank prepared by the above procedure.

Si chips (10 mm×30 mm) each having a Ru film or a TaBSiON film deposited thereon by the following method as samples were placed on a sample support (4 inch quartz substrate) of a RF plasma etching apparatus. In such a state, plasma RF etching was carried out on the Ru film on the TaBSiN film of the Si chip placed on the sample support under the following conditions.

Bias RF: 50 W
Etching time: 120 sec
Trigger pressure: 3 Pa
Etching pressure: 1 Pa
Etching gas: $Cl_2$/Ar
Gas flow rate ($Cl_2$/Ar): 20/80 sccm
Distance between electrode substrates: 55 mm Film deposition of the Ru film was carried out by ion beam sputtering under the following deposition conditions.

(Deposition Conditions for Ru Film)
Target: Ru target
Sputtering gas: Ar gas (gas pressure: 2 mTorr, flow rate: 15 sccm)
Output: 150 W
Deposition rate: 0.023 nm/sec
Film thickness: 2.5 nm The TaBSiN film was deposited by simultaneously discharging a TaB target and a Si target in a nitrogen atmosphere by magnetron sputtering. Film deposition was carried out under any of the following three types of conditions.

(Deposition conditions (1) for TaBSiN Film)
Target: TaB target (compositional ratio: Ta 80 at %, B 20 at %), Si target
Sputtering gas: gas mixture of Ar and $N_2$ (Ar: 86 vol %, $N_2$: 14 vol %, gas pressure: 2 mTorr)
Output: 150 W (TaB target), 30 W (Si target)
Deposition rate: 0.13 nm/sec
Film thickness: 60 nm (Deposition Conditions (2) for TaBSiN Film)
Target: TaB target (compositional ratio: Ta 80 at %, B 20 at %), Si target
Sputtering gas: Ar gas, $N_2$ gas (Ar: 86 vol %, $N_2$: 14 vol %, gas pressure: 2 mTorr)
Output: 150 W (TaB target), 50 W (Si target)
Deposition rate: 0.12 nm/sec
Film thickness: 60 nm (Deposition Conditions (3) for TaBSiN Film)
Target: TaB target (compositional ratio: Ta 80 at %, B 20 at %), Si target
Sputtering gas: Ar gas, $N_2$ gas (Ar: 86 vol %, $N_2$: 14 vol %, gas pressure: 2 mTorr, flow rate: 13 sccm (Ar), 2 sccm ($N_2$))
Output: 150 W (TaB target), 100 W (Si target)
Deposition rate: 0.11 nm/sec
Film thickness: 60 nm The etching rates were obtained with respect to the Ru film and the TaBSiN films (1) to (3) deposited under the above conditions, to determine the etching selectivity using the following formula.

Etching selectivity=(etching rate of TaBSiN film)/(etching rate of Ru film)

The etching selectivity relative to the protective layer 13 is preferably at least 10, and the etching selectivity of the TaBSiN films (1) to (3) were as follows, and a sufficient selectivity was obtained with respect to any film.

TaBSiN film (1): 10.0
TaBSiN film (2): 12.3
TaBSiN film (3): 13.9

Comparative Example 1

Comparative Example 1 was carried out in the same manner as in Example 1 except that the absorber layer was a film of a nitride of a tantalum/boron alloy (TaBN) containing no silicon (Si). The TaBN film was deposited by using a TaB target (Ta:B=80 at %:20 at %) under the following conditions.

(Deposition Conditions for TaBN Layer)
Target: TaB target (compositional ratio: Ta 80 at %, B 20 at %)
Sputtering gas: Ar gas, $N_2$ gas (Ar: 86 vol %, $N_2$: 14 vol %, gas pressure: 0.3 Pa)
Electric power applied: 150 W
Deposition rate: 0.1 nm/sec
Film thickness: 60 nm The composition (at %) of the obtained TaBN film was measured by using an X-ray photoelectron spectrometer and as a result, Ta:B:N=50:4:46.

The crystal structure of the obtained TaBN film was confirmed by an X-ray diffractmeter and as a result, the TaBN layer was confirmed to be crystalline since a sharp peak was observed in the obtained diffraction peak.

The surface roughness on the surface of the TaBN film was confirmed by an atomic force microscope and as a result, it was 0.5 nm rms, and the surface roughness was great as compared with the absorber layer (TaBSiN layer) in Example 1.

Optimization of the deposition conditions was carried out using the above TaB target, but every film had a B content less than 5 at %, and no TaBN film having an amorphous structure could be obtained.

Comparative Example 2

Comparative Example 2 was carried out in the same manner as in Example 1 except that the absorber layer is a film of a nitride of a tantalum/boron alloy (TaBN) containing no silicon (Si). The TaBN film was deposited by using a TaB target (Ta:B=50 at %:50 at %) under the following conditions.
(Deposition Conditions for TaBN Layer)
Target: TaB target (compositional ratio: Ta 50 at %, B 50 at %)
Sputtering gas: Ar gas, $N_2$ gas (Ar: 86 vol %, $N_2$: 14 vol %, gas pressure: 0.3 Pa)
Electric power applied: 150 W
Deposition rate: 0.07 nm/sec
Film thickness: 60 nm The composition (at %) of the obtained TaBN film was measured by using an X-ray photoelectron spectrometer and as a result, the B content was at least 5%.

The crystal structure of the TaBN film after film deposition was confirmed by an X-ray diffractmeter and as a result, the absorber layer was confirmed to be an amorphous structure or a microcrystal structure since no sharp peak was observed in the obtained diffraction peak.

Further, the surface roughness on the surface of the TaBN film after film deposition was confirmed by an atomic force microscope and as a result, it was 0.2 nm rms.

Further, in the same manner as in Example 1, the reflectances to pattern inspection light (wavelength 257 nm) on the surface of the protective layer (Ru layer) 13 and on the surface of the TaBN layer were measured. As a result, the reflectance was 60.0% on the surface of the protective layer 13 and the reflectance was 9.9% on the surface of the TaBN layer. The contrast was determined from the above results and from the above-described formula and as a result, it was 71.7%, and it was confirmed that the contrast was low as compared with Example 1.

The etching properties were evaluated with respect to the TaBN film in the same procedure as above. As a result, the etching selectivity of the TaBN film was 12.8.

The deposition rate of the TaBN layer in Comparative Example 2 was about two-thirds of the deposition rate in Example 1 and was considerably low. Further, to confirm reproducibility, film deposition was carried out several times under the conditions in Comparative Example 2, but discharge was unstable, and film deposition could not be conducted in some cases, or it was very difficult to control the film composition or the film thickness.

Comparative Example 3

Comparative Example 3 is carried out in the same manner as in Example 1 except that the B concentration in the TaBSiN layer is less than 1 at %.

The crystal structure of the obtained TaBSiN layer is confirmed by an X-ray diffractmeter and as a result, the TaBSiN layer is confirmed to be crystalline, since a sharp peak is observed in the obtained diffraction peak.

Comparative Example 4

Comparative Example 4 is carried out in the same manner as in Example 1 except that the B content in the TaBSiN layer exceeds 5 at %.

In Comparative Example 4, the deposition rate of the TaBSiN layer is remarkably low as compared with Example 1. Further, to confirm reproducibility, film deposition is carried out several times under the conditions in Comparative Example 4, whereupon film deposition cannot be conducted in some cases due to unstable discharge or it is very difficult to control the film composition or the film thickness.

Comparative Example 5

Comparative Example 5 is carried out in the same manner as in Example 1 except that the Si content in the TaBSiN layer is less than 1%.

The crystal structure of the obtained TaBSiN layer is confirmed by an X-ray diffractmeter and as a result, the TaBSiN layer is confirmed to be crystalline, since a sharp peak is observed in the obtained diffraction peak.

Comparative Example 6

Comparative Example 6 is carried out in the same manner as in Example 1 except that the Si content in the TaBSiN layer exceeds 25%.

The EUV light reflectance on the surface of the obtained TaBSiN layer is measured and as a result, it is 0.8%, and the absorber layer is confirmed to be inferior in the EUV light absorption properties to the absorber layer in Example 1.

The entire disclosure of Japanese Patent Application No. 2006-117992 filed on Apr. 21, 2006 including specification, claims, drawings and summary is incorporated herein by reference in its entirety.

What is claimed is:

1. A reflective mask blank for EUV lithography, comprising:
a substrate;
a reflective layer for reflecting EUV light; and
an absorber layer for absorbing EUV light,
wherein the reflective layer and the absorber layer are formed in an order of the reflective layer and the absorber layer on the substrate, the absorber layer contains Ta, B, Si and N, and in the absorber layer, the content of B is at least 1 at % and less than 5 at %, the content of Si is from 1 to 25 at %, and the compositional ratio of Ta to N, Ta:N, is from 8:1 to 1:1.

2. The reflective mask blank for EUV lithography according to claim 1, wherein the absorber layer is in an amorphous state.

3. The reflective mask blank for EUV lithography according to claim 1, wherein the surface roughness on the surface of the absorber layer is at most 0.5 nm rms.

4. The reflective mask blank for EUV lithography according to claim 2, wherein the surface roughness on the surface of the absorber layer is at most 0.5 nm rms.

5. The reflective mask blank for EUV lithography according to claim 1, further comprising a low reflective layer to inspection light for inspection of a mask pattern, wherein the low reflective layer is formed on the absorber layer, the low reflective layer contains Ta, B, Si and O, and in the low reflective layer, the content of B is at least 1 at % and less than 5 at %, the content of Si is from 1 to 25 at %, and the compositional ratio of Ta to O, Ta:O, is from 7:2 to 1:2.

6. The reflective mask blank for EUV lithography according to claim 2, further comprising a low reflective layer to inspection light for inspection of a mask pattern, wherein the low reflective layer is formed on the absorber layer, the low reflective layer contains Ta, B, Si and O, and in the low reflective layer, the content of B is at least 1 at % and less than 5 at %, the content of Si is from 1 to 25 at %, and the compositional ratio of Ta to O, Ta:O, is from 7:2 to 1:2.

7. The reflective mask blank for EUV lithography according to claim 1, further comprising a low reflective layer to inspection light for inspection of a mask pattern, wherein the low reflective layer is formed on the absorber layer, the low reflective layer contains Ta, B, Si, O and N, and in the low reflective layer, the content of B is at least 1 at % and less than 5 at %, the content of Si is from 1 to 25 at %, and the compositional ratio of Ta to O and N, Ta:(O+N), is from 7:2 to 1:2.

8. The reflective mask blank for EUV lithography according to claim 2, further comprising a low reflective layer to inspection light for inspection of a mask pattern, wherein the low reflective layer is formed on the absorber layer, the low reflective layer contains Ta, B, Si, O and N, and in the low reflective layer, the content of B is at least 1 at % and less than 5 at %, the content of Si is from 1 to 25 at %, and the compositional ratio of Ta to O and N, Ta:(O+N), is from 7:2 to 1:2.

9. A reflective mask blank for EUV lithography comprising:
a substrate;
a reflective layer for reflecting EUV light;
an absorber layer for absorbing EUV light; and
a low reflective layer to inspection light for inspection of a mask pattern formed on the absorber layer,
wherein the reflective layer, the absorber layer and the low reflective layer are formed in an order of the reflective layer, the absorber layer and the low reflective layer on the substrate, the low reflective layer contains Ta, B, Si and O, and in the low reflective layer, the content of B is at least 1 at % and less than 5 at %, the content of Si is from 1 to 25 at %, and the compositional ratio of Ta to O, Ta:O, is from 7:2 to 1:2.

10. A reflective mask blank for EUV lithography comprising
a substrate;
a reflective layer for reflecting EUV light;
an absorber layer for absorbing EUV light; and
a low reflective layer to inspection light for inspection of a mask pattern,
wherein the reflective layer, the absorber layer and the low reflective layer are formed in an order of the reflective layer, the absorber layer and the low reflective layer on the substrate, the low reflective layer contains Ta, B, Si, O and N, and in the low reflective layer, the content of B is at least 1 at % and less than 5 at %, the content of Si is from 1 to 25 at %, and the compositional ratio of Ta to O and N, Ta:(O+N), is from 7:2 to 1:2.

11. The reflective mask blank for EUV lithography according to claim 9, wherein the surface roughness on the surface of the low reflective layer is at most 0.5 nm rms.

12. The reflective mask blank for EUV lithography according to claim 10, wherein the surface roughness on the surface of the low reflective layer is at most 0.5 nm rms.

13. The reflective mask blank for EUV lithography according to claim 9, wherein the low reflective layer has a thickness of from 5 to 30 nm.

14. The reflective mask blank for EUV lithography according to claim 10, wherein the low reflective layer has a thickness of from 5 to 30 nm.

15. The reflective mask blank for EUV lithography according to claim 9, further comprising a protective layer for protecting the reflective layer at the time of forming a pattern on the absorber layer, wherein the protective layer is formed between the reflective layer and the absorber layer, and the contrast is at least 30% as between the reflected light on the surface of the protective layer and the reflected light on the surface of the low reflective layer at a wavelength of light to be used for inspection of a pattern to be formed on the absorber layer.

16. The reflective mask blank for EUV lithography according to claim 10, further comprising a protective layer for protecting the reflective layer at the time of forming a pattern on the absorber layer, wherein the protective layer is formed between the reflective layer and the absorber layer, and the contrast is at least 30% as between the reflected light on the surface of the protective layer and the reflected light on the surface of the low reflective layer at a wavelength of light to be used for inspection of a pattern to be formed on the absorber layer.

17. The reflective mask blank for EUV lithography according to claim 15, wherein the protective layer is formed by one of a Ru compound, $SiO_2$ and CrN.

18. The reflective mask blank for EUV lithography according to claim 16, wherein the protective layer is formed by one of a Ru compound, $SiO_2$ and CrN.

19. The reflective mask blank for EUV lithography according to claim 9, wherein the reflectance on the surface of the low reflective layer is at most 15% at a wavelength of light for inspection of a pattern to be formed on the absorber layer.

20. The reflective mask blank for EUV lithography according to claim 10, wherein the reflectance on the surface of the low reflective layer is at most 15% at a wavelength of light for inspection of a pattern to be formed on the absorber layer.

21. The reflective mask blank for EUV lithography according to claim 1, wherein the absorber layer is formed by sputtering using a TaBSi compound target in an atmosphere containing nitrogen.

22. The reflective mask blank for EUV lithography according to claim 2, wherein the absorber layer is formed by sputtering using a TaBSi compound target in an atmosphere containing nitrogen.

23. The reflective mask blank for EUV lithography according to claim 21, wherein the TaBSi compound target has a composition of Ta=50 to 94 at %, Si=5 to 30 at % and B=1 to 20 at %.

24. The reflective mask blank for EUV lithography according to claim 22, wherein the TaBSi compound target has a composition of Ta=50 to 94 at %, Si=5 to 30 at % and B=1 to 20 at %.

25. The reflective mask blank for EUV lithography according to claim 9, wherein the low reflective layer is formed by sputtering using a TaBSi compound target in an atmosphere containing oxygen.

26. The reflective mask blank for EUV lithography according to claim 10, wherein the low reflective layer is formed by sputtering using a TaBSi compound target in an atmosphere containing oxygen.

27. The reflective mask blank for EUV lithography according to claim 25, wherein the TaBSi compound target has a composition of Ta=50 to 94 at %, Si=5 to 30 at % and B=1 to 20 at %.

28. The reflective mask blank for EUV lithography according to claim 26, wherein the TaBSi compound target has a composition of Ta=50 to 94 at %, Si=5 to 30 at % and B=1 to 20 at %.

* * * * *